(12) United States Patent
Fagrenius et al.

(10) Patent No.: US 7,383,977 B2
(45) Date of Patent: Jun. 10, 2008

(54) METHOD FOR ATTACHING A SHIELD CAN TO A PCB AND A SHIELD CAN THEREFOR

(75) Inventors: Gustav Fagrenius, Lund (SE); Fredrik Palmqvist, Staffanstorp (SE)

(73) Assignee: Sony Ericsson Mobile Communications AB, Lund (SE)

( * ) Notice: Subject to any disclaimer, the term of this patent is extended or adjusted under 35 U.S.C. 154(b) by 179 days.

(21) Appl. No.: 10/512,012

(22) PCT Filed: Mar. 31, 2003

(86) PCT No.: PCT/EP03/03356

§ 371 (c)(1),
(2), (4) Date: Nov. 12, 2004

(87) PCT Pub. No.: WO03/094588

PCT Pub. Date: Nov. 13, 2003

(65) Prior Publication Data

US 2005/0254224 A1  Nov. 17, 2005

Related U.S. Application Data

(60) Provisional application No. 60/377,743, filed on May 3, 2002.

(30) Foreign Application Priority Data

Apr. 30, 2002  (EP)  ................................. 02388032

(51) Int. Cl.
*B23K 31/00*  (2006.01)
*B23K 31/02*  (2006.01)
*H05K 9/00*  (2006.01)

(52) U.S. Cl. ................. 228/180.21; 174/385; 174/376; 174/377; 29/592.2

(58) Field of Classification Search ................. 29/840, 29/841, 592.1; 228/180.1, 180.21; 174/385, 174/377, 376
See application file for complete search history.

(56) References Cited

U.S. PATENT DOCUMENTS

| 4,838,475 A | 6/1989 | Mullins et al. |
| 5,235,131 A * | 8/1993 | Mueller et al. ........... 174/35 R |
| 5,633,786 A | 5/1997 | Matuszewski et al. |
| 6,796,485 B2 * | 9/2004 | Seidler ....................... 228/255 |
| 2001/0001989 A1 * | 5/2001 | Smith ......................... 174/52.1 |

FOREIGN PATENT DOCUMENTS

| EP | 1130953 | 9/2001 |
| GB | 2153152 | 8/1985 |
| WO | WO 01/56347 | 8/2001 |

* cited by examiner

*Primary Examiner*—Hung V. Ngo
(74) *Attorney, Agent, or Firm*—Renner, Otto, Boisselle & Sklar, LLP

(57) ABSTRACT

A method for providing a PCB (printed circuit board) with a shield can (1) comprising a metal shell with a free rim (5). The method prescribes that the rim (5) of the shield can (1) is provided with an extra amount of solder (8) before the shield can (1) is placed on the PCB. A shield can (1) is also described.

3 Claims, 2 Drawing Sheets

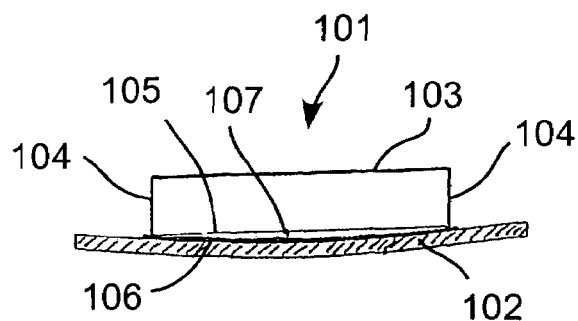
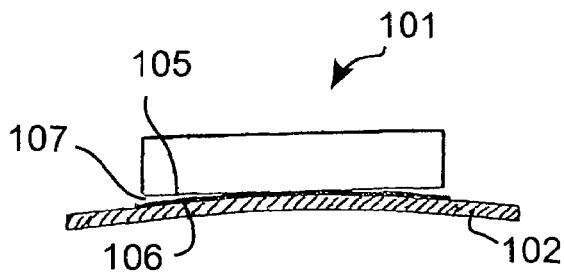
Fig. 1a (Prior Art)　　　Fig. 1b (Prior Art)
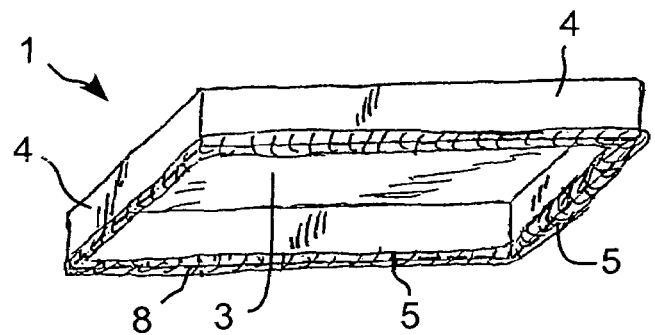
Fig. 2
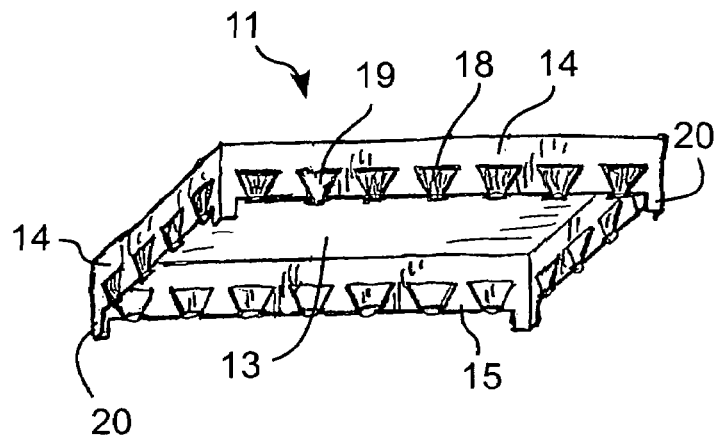
Fig. 3

METHOD FOR ATTACHING A SHIELD CAN TO A PCB AND A SHIELD CAN THEREFOR

This patent application claims the benefit of priority from U.S. Provisional Patent Application Ser. No. 60/377,743 filed on May 3, 2002. This application incorporates by reference the entire disclosure of U.S. Provisional Patent Application Ser. No. 60/377,743.

TECHNICAL FIELD

The invention relates to a method for providing a PCB (printed circuit board) with a shield can comprising a metal shell with a free rim, which method comprises the steps of:
   providing the PCB with solder,
   placing the shield can on the PCB with the rim towards the PCB,
   heating the PCB and the shield can to a temperature above a melting temperature of the solder,
   cooling the PCB and the shield can.
The invention also relates to a shield can for use in this method.

RELATED PRIOR ART

In order to shield electronic components on a PCB (printed circuit board) in electronic devices against electromagnetic radiation, a shielding in the form of an electrically conductive shield can or box is normally placed on the PCB covering the electronic components. The highest level of shielding is achieved when a closed metal can with a free rim at downwardly extending side pieces is soldered to the PCB along the entire free edge of the metal can. A critical requirement that must be fulfilled in order to achieve good shielding is that the solder joint between the shield can and the PCB is well controlled, preferably without leaving any unsoldered areas. If any areas remain unsoldered the shielding efficiency is determined by the largest gap between the shield can and the PCB. Therefore, if gaps exist between the shield can and the PCB the sizes of these must be well defined.

The first step in a soldering process is to screen-print the PCB with solder paste at the desired areas. The thickness of the solder paste is determined by the thickness of the screen-printing stencil and is the same all over the PCB. The next step is to place the electronic components on the PCB by a pick-and-place machine. The shield cans are normally placed on the PCB after the other components have been placed since the shield can must cover one or more of them. In the last step of the process the PCB is heated in a soldering oven, whereby the applied solder paste melts and all the components and the shield can(s) become soldered to the PCB.

Since small components, such as resistors and capacitors, need small volumes of solder paste and large components, such as shield cans, need large volumes of solder pate, the thickness of the screen-printing stencil has to be set as a compromise between these two different needs.

However, neither the shield cans nor the PCBs can be manufactured perfectly flat and, furthermore, the flatness of the PCB may be affected by the heat in the soldering oven. This means that there will always be a gap between the shield can and the PCB, which, however, is not a problem as long as the gap is filled with solder during heating. As described above the thickness of the solder paste initially applied to the PCB is limited which means that the acceptable size of the gap is also limited, if it must be ensured that the gap becomes filled with solder. Furthermore, the size of the gap between the shield can and the PCB increases with the size of the shield can, and the size of the shield can must therefore be limited in order to ensure that the gap can be filled with the pre-applied solder paste.

An attempt to overcome this problem has been to dispense extra solder paste to the area of the PCB where the shield can is to be positioned which, however, calls for an undesired extra manufacturing step.

OBJECT OF THE INVENTION

It is an object of the invention to provide a method of providing a PCB with a shield can in which the risk of unacceptable gaps between the mounted shield can and the PCB is eliminated and a shield can for use in such method.

SUMMARY OF THE INVENTION

The object of the invention is achieved by providing the rim of the shield can with an extra amount of solder before the shield can is placed on the PCB: Thereby is obtained that when the shield can and the PCB are heated in the oven, the extra amount of solder provided on the rim of the shield can melts and flows down to close—or at least partly close in a controllable manner—any gap between the rim of the shield can and the PCB. If any gaps between the rim of the shield can and the PCB are left open, the shield should be structured in such manner that the sizes of the gaps are well defined.

A first, simple method of providing the rim of the shield can with the extra amount of solder is achieved by dipping it partly into a bath of molten solder.

A second method is to provide recesses at the rim of the shield can before the extra amount of solder is applied thereto; and apply the extra amount of solder to these recesses.

A preferred method of providing the rim of the shield can with such recesses with the extra amount of solder is by a screen-printing process.

A third method is to provide indentations at the rim of the shield can before the extra amount of solder is applied thereto, and apply the extra amount of solder to these indentations.

A shield can for use in this method for providing a PCB with a shield can comprises a metal shell with a free rim that is provided with an extra amount of solder. Such shield can can be placed on the PCB in any ordinary way and be safely connected to the PCB leaving only well-defined gaps between the rim of the shield and the PCB, if any.

In a first embodiment of the invention the rim of the shield can is provided with a plurality of recesses, each of which is provided with an extra amount of solder. When the shield can and the PCB is heated in the oven, the extra amount of solder melts and flows in a controlled pattern from the rim of the shield to the PCB by forming bridges that interconnect the rim of the shield can with the PCB.

Preferably, each recess is V-shaped, such that it can receive a relatively large amount of solder, but only allows it to flow out in a narrow stream when it melts.

In another embodiment the rim of the shield can is provided with a plurality of indentations, each of which is provided with an extra amount of solder. The indentations are preferably also V-shaped.

In a preferred embodiment the shield can is box-shaped with a flat upper shell part and four downwardly extending side pieces with the free rim. Such shape of the shield can be easily adapted to a standard PCB.

The side pieces of the shield can can be interconnected at adjoining corners, and each corner can be provided with a leg that protrudes downwards beyond the free rim. Thereby is achieved that the shield can rests on its legs and allows the PCB to bend upwards or downwards.

It shall be emphasised that the term "comprise/comprising" when used in this specification is taken to specify the presence of stated features, integers, steps or components, but does not preclude the presence or addition of one or more other features, integers, steps components or groups thereof.

DESCRIPTION OF THE DRAWINGS

The invention will be described in detail in the following with reference to the drawings in which FIGS. 1a and 1b illustrate the problems associated with the prior art shield cans;

FIG. 2 shows a first embodiment of a shield can according to the invention;

FIG. 3 shows a second embodiment of a shield can according to the invention;

DETAILED DESCRIPTION OF AN EMBODIMENT OF THE INVENTION

Figure 4:
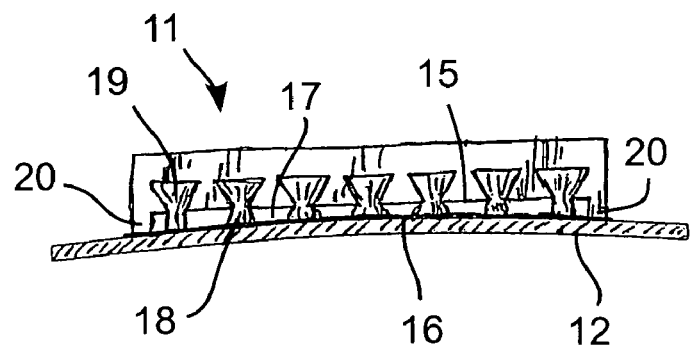
FIG. 4 shows how the second embodiment of a shield can according to the invention is connected to a PCB.

FIGS. 1a and 1b illustrate in cross-sections taken through the shield can and the PCB the problems associated with the prior art shield cans 101 when they are mounted on a PCB 102. In the embodiment shown, the shield can 101 is box-shaped and consists of a metal shell forming a flat upper shell part 103 and four downwardly extending side pieces 104 with a free rim 105. As described above PCBs 102 are never totally flat due to internal stresses in the PCB 102 occasioned by the manufacturing process. FIGS. 1a and 1b each shows a PCB 102 that bends downwards and upwards, respectively. In order to better illustrate the problems associated with the prior art mounting of a shield can 101 on a PCB 102 the bending of the PCBs 102 as shown in FIGS. 1a and 1b is exaggerated. Furthermore, for clarity reasons no other components than the shield can 101 is shown; in practice the electronic components to be shielded are positioned on the PCB 102 within the mounted shield can 101. In FIGS. 1a and 1b the PCB 102 is provided with a pre-applied thin layer of solder paste 106 provided at the area where the rim 105 of the shield can 101 is intended to be connected to the PCB 102 by heating the pre-applied solder.

In FIG. 1a the PCB 102 bends downwards, and due to this downwards bending a gap 107 exists between the PCB 102 and the rim 105 of the shield can 101. It is not possible to close the gap 107 with the pre-applied solder 106, and if the PCB 102 bends as much as shown in FIG. 1a the gap 106 extends from one side of the shield can 101 to the other. Thereby the shielding efficiency is substantially reduced.

In the situation shown in FIG. 1b the PCB 102 bends upwards and the rim 105 of the shield can 101 is connected to the PCB 102 at a very limited area only. In this instance the gap 107, which is not closed by the pre-applied solder 106, between the PCB 102 and the rim 105 of the shield can 101 extends over more than two sides of the shield can 101. Again the shielding efficiency of the shield can 101 is substantially reduced.

In practice, the PCB 102 bends less than shown in FIGS. 1a and 1b and the gap 107 is smaller than shown. However, since the degree of bending of the PCB 102—and of the shield can 101 as well—is unpredictable, there is always a risk that a gap 107 of an unpredictable size occurs, thereby reducing the shielding efficiency.

FIG. 2 shows a first embodiment of a shield can 1 according to the invention. The shield can 1 is box-shaped and comprises of a metal shell forming a flat upper shell part 3 and four downwardly extending side pieces 4 with a free rim 5 shown in broken lines. The rim 5 is provided with an extra amount of solder forming a bead of solder 8 that may be applied by dipping the rim 5 of the shield can into a bath of molten solder. When the shield can 1 is placed on a PCB and is heated in an oven the bead of solder 8 melts, and due to the force of gravity the extra amount of molten solder flows downwards into intimate contact with the desired area of PCB. Even if the PCB is not straight, the molten solder contacts the PCB and closes or seals any gaps existing prior to heating. This method of soldering a shield can to a PCB is of course also applicable if the shield can is not box-shaped as shown.

FIG. 3 shows a second embodiment of a shield can 11 according to the invention. The shield can 11 is also box-shaped and comprises a metal shell forming a flat upper shell part 13 and four downwardly extending side pieces 14 with a free rim 15. Again, the rim 15 is provided with an extra amount of solder 18 located in pockets or recesses 19 provided at the side pieces of the shield can 11. In the embodiment shown in FIG. 3 the recesses are formed by embossing the side pieces as clearly shown at the recess 19 which for illustration purposes is not filled with solder 18. The shield can 11 is provided with a downwardly extending leg 20 at each corner, which legs 20 are to abut on the PCB when the shield can 11 is mounted as described below with reference to FIG. 4. The number of legs 20 is not critical to the method of mounting the shield can 11 on the PCB, and if desired it may be increased or decreased or the legs 20 may even be omitted.

The recesses 19 are V-shaped in order to control the "delivery" of solder 18 when the shield can 11 is placed on a PCB and heated as described below.

FIG. 4 shows the shield can 11 placed on a PCB 12 that bends upwards. The PCB 12 is provided with a thin layer of solder paste 16 at the areas directly below the rim 15 of the shield can 11. As illustrated, the shield can 11 abuts on the PCB 12 by the legs 20, thereby forming a large gap 17 between the rim 15 of the shield can 11 and the PCB 12. However, when the shield can 11 with the extra amount of solder 18 and the PCB 12 are heated in an oven, the extra amount of solder 18 melts and flows down and out of the V-shaped recesses 19 forming bridges 18' between the rim 15 of the shield can 11 and the PCB 12 as shown.

The bridges 18' can have different widths determined by the amount of solder 18 and the distance between the rim 15 of the shield can 11 and the PCB 12. However, the sizes of the remaining gaps 17 are all well-defined since the distances between the bridges 18' corresponding to the distances between the recesses 19 are known. Generally, the gaps 17 should be kept as small as possible in order to provide sufficient shielding. This can easily be achieved by dimensioning the distance between the recesses 19 correctly.

As it is clearly seen in FIG. 4, the length of the legs 20 determines how much the PCB 12 is allowed to bend upwards while still ensuring that the shield can 11 maintains its proper function; i.e. the shorter the legs 20, the less bending of the PCB 12 is acceptable. If the legs 20 are very short the molten solder 18 may flow out of the recesses 19 and fill up the entire gap 17 between the rim 15 of the shield can 11 and the PCB 12. Thereby excellent shielding is achieved. Likewise, if the legs 20 are long or if the PCB bends downwards as shown in FIG. 1a, some bridges 18' may be long and thin while others are short and thick. However, by keeping the distances between the recesses 19 within certain limits it can be ensured that all gaps 17 have a limited diagonal expanse such that an acceptable shielding is obtained.

The recesses 19 of the shield can 11 can be provided with solder 18 in different ways, e.g. by screen printing or by dispensing. If the solder 18 is applied by screen printing no screen stencil is required due to the shape of the recesses.

Figure 5:
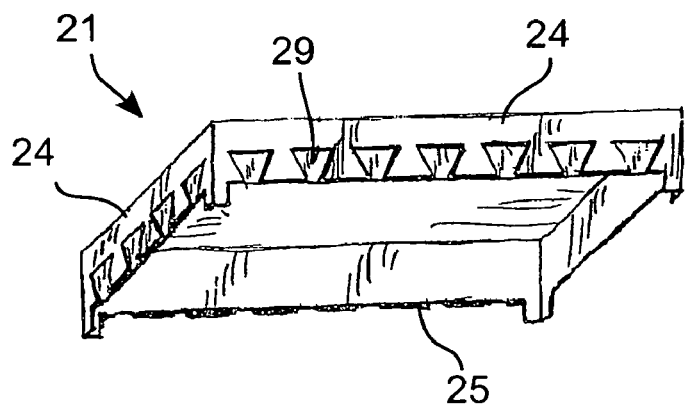
FIG. 5 shows a third embodiment of a shield can according to the invention.

FIG. 5 shows a third embodiment of a shield can 21 according to the invention. The shield can 21 corresponds essentially to the shield can 11 shown in FIG. 3 and can be used in the exact same manner. The main difference between the shield can 21 shown in FIG. 5 and the shield can 11 shown in FIG. 3 is that the recesses 29 at the rim 25 are formed by etching into the surface of the side pieces 24 of the shield can 21, whereas the recesses 19 are formed by embossing the side pieces 14 of the shield can 11. In all other respects the shield can 21 corresponds to the shield can 11 and will not be described in further details.

Figure 6:
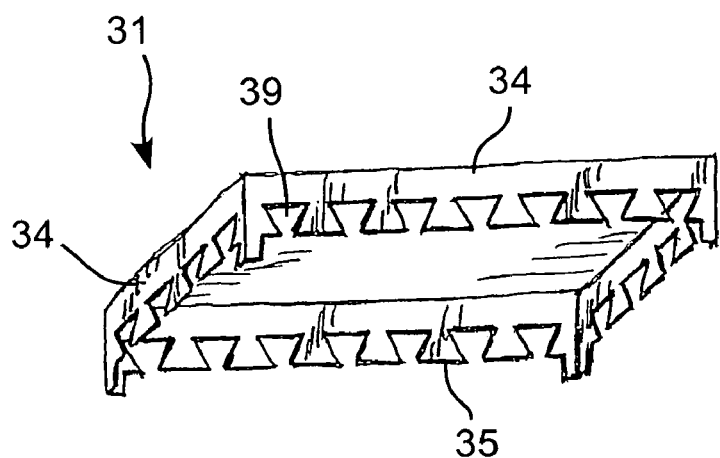
FIG. 6 shows a fourth embodiment of a shield can according to the invention.

FIG. 6 shows a fourth embodiment of a shield can 31 according to the invention. This shield can 31 corresponds essentially to the shield cans 11 shown in FIG. 3 and the shield can 21 shown in FIG. 5. The main difference is that the side pieces 34 are not provided with recesses for receiving solder, but with V-shaped indentations 39 that can be filled with solder.

When the shield can 31 is heated the solder flowing out of the indentations may leave openings. However, this is acceptable as long as the size of each opening is well-defined with a limited diagonal expanse.

For clarity reasons the shield cans 21 and 31 are shown without solder applied to the recesses 29 and indentations 39.

The invention has been described with reference to preferred embodiments of a box-shaped the shield can. However, the shield can need not be box-shaped; it may also be dome-shaped or shaped as any other hollow, three-dimensional member provided with a free rim onto which an extra amount of solder may be applied before the shield can is placed on a PCB.

If the shield can is provided with recesses and/or indentations these may have any suitable form other than the preferred V-shape shown in FIGS. 3-6. Also, if the shield can is provided with downwardly protruding legs, the number and length of these may be different from the ones shown in FIGS. 3-6. Still further modifications of the shield may be suitable in certain applications as long as the free rim of the shield can can be provided with an extra amount of solder.

The invention claimed is:

1. A method for providing a POB (printed circuit board) with a shield can comprising a metal shell having a free rim, said method comprising the steps of:
   providing a shield can comprising a metal shell having a free rim and recesses provided at the rim;
   providing the PCB with solder;
   placing the shield can on the PCB with the rim towards the PCB;
   heating the PCB and the shield can to a temperature above a melting temperature of the solder; and
   cooling the PCB and the shield can, wherein an extra amount of solder is applied to the recesses of the shield can before the shield can is placed on the PCB.

2. The method according to claim 1, wherein the rim of the shield can is provided with the extra amount of solder by a screen-printing process.

3. A method for providing a PCB (printed circuit board) with a shield can comprising a metal shell having a free rim, said method comprising the steps of:
   providing a shield can comprising a metal shell having a free rim and indentations at the rim;
   providing the PCB with solder;
   placing the shield can on the PCB with the rim towards the PCB;
   heating the PCB and the shield can to a temperature above a melting temperature of the solder; and
   cooling the PCB and the shield can, wherein an extra amount of solder is applied to the indentations of the shield can before the shield can is placed on the PCB.

* * * * *